United States Patent [19]

Fuller et al.

[11] 3,856,648

[45] Dec. 24, 1974

[54] METHOD OF FORMING CONTACT AND INTERCONNECT GEOMETRIES FOR SEMICONDUCTOR DEVICES AND INTEGRATED CIRCUITS

[75] Inventors: Clyde Rhea Fuller, Plano; Prabhakar Bhimrao Ghate, both of Dallas, Tex.

[73] Assignee: Texas Instruments Incorporated, Dallas, Tex.

[22] Filed: Dec. 19, 1973

[21] Appl. No.: 426,408

[52] U.S. Cl. .............................................. 204/192
[51] Int. Cl. .............................................. C23c 15/00
[58] Field of Search .................................... 204/192

[56] References Cited

UNITED STATES PATENTS

| | | | |
|---|---|---|---|
| 3,442,701 | 5/1969 | Lepselter | 204/192 |
| 3,616,401 | 10/1971 | Cunningham et al. | 204/192 |
| 3,653,999 | 4/1972 | Fuller | 204/192 |

OTHER PUBLICATIONS

"The Application of Sputtering to Beam-Lead Technology," by P. G. Luke, Microelectronics, Vol. 3, No. 6, (June 1970).

"Application of Sputtering in the Fabrication of Semiconductor Devices," by Legat et al., Solid State Technology, Vol. 13, No. 12, (Dec. 1970).

"Characteristics of NbN Dayem Bridges," by Janocko et al., Journal of Applied Physics, Vol. 42, No. 1, (January 1971).

*Primary Examiner*—John H. Mack
*Assistant Examiner*—Wayne A. Langel
*Attorney, Agent, or Firm*—Harold Levine; James T. Comfort; Gary C. Honeycutt

[57] ABSTRACT

An improved method of forming interconnections on a semiconductor slice containing a plurality of devices in which layers of Ti:W, a conducting metal and Ti:W are deposited, the interconnections masked using aluminum, the top Ti:W layer removed, the conducting layer sputter etched, and the bottom layer of TI:W then removed resulting in an interconnection geometry which maintains adequate control of conductor width and spacing and avoids problems at crossovers when forming multiple level connections.

15 Claims, 4 Drawing Figures

PATENTED DEC 24 1974 3,856,648

METHOD OF FORMING CONTACT AND INTERCONNECT GEOMETRIES FOR SEMICONDUCTOR DEVICES AND INTEGRATED CIRCUITS

BACKGROUND OF THE INVENTION

This invention relates to semiconductor devices in general and more particularly to devices having a large plurality of metal interconnecting leads thereon.

Integrated circuit chips are presently being manufactured with a number of devices on a single chip in the range of 5,000 to 10,000. With such a large number of devices, a corresponding large number of interconnections are required to construct, for example, a mini computer on a small chip. In order to obtain the required number of interconnections, multiple levels of interconnections are often required. The construction of such multiple layers of interconnections raises a number of problems. The typical manner of forming interconnections in the prior art comprised depositing a layer of metal and then chemically etching that metal to obtain the required interconnections. To place a second level of interconnections on the circuit, a layer of insulation is first placed over the first level of interconnections and then a second metal layer deposited thereon and etched. The type of problem encountered using prior art methods is illustrated by FIG. 1. As shown in simplified form thereon, interconnections 10 formed by chemical etching of a metal on top of the circuit results in connections which have edges 13 essentially perpendicular to the plane of the chip. Furthermore, where two metals such as layers 12 and 14 of Ti:W and a layer 17 of gold are used, undercutting 18 results. The layer 15 of insulating material is then placed atop the chip covering the interconnections 11 and atop that is placed another layer of metal which may then be etched. Because of the sharp slope of the edges 13 and the undercut areas 18, the metal does not reach its full thickness in areas 19 and is subject to cracks and other deficiencies. Thus, failures can occur particularly when the circuit is placed under various thermal stresses.

In addition, the line widths in such devices often have separations of less than 3 micrometers. In chemical etching metal thicknesses are limited to being less than or equal to 0.5 micrometers for spacings less than or equal to 3 micrometers. This leads to difficulty in maintaining proper line widths and spacing through the use of the chemical etching. Thus, it can be seen that there is a need for a new method which will permit providing multiple levels of metalization on a circuit of this nature while at the same time maintaining well defined lead geometries.

SUMMARY OF THE INVENTION

The method of the present invention solves the above noted need through the use of RF sputter etching for metal removal. It overcomes the limitations placed on leads when using wet chemical processes, i.e., the metal thickness may be approximately the same as the smallest lead separation. In addition, sputter etching results in a slope on the leads which is not perpendicular to the base but makes an angle therewith permitting the insulation layer and second layer of metalization to be deposited without the problem of sharp edges wherein cracks can develop. Although sputter etching has been previously used in interconnect geometry formation on semiconductor devices, it suffers several drawbacks that have limited its use. First, differential sputtering rates between the metals typically used for semiconductor device contacts and interconnects and the organic photolithographic materials used as masking agents to allow selective metal removal are such that fine geometries or thick metal leads are difficult to achieve. Metal masking may be employed. For this technique the metal layer which is to act as a mask must be deposited over the interconnect metal layer and then be patterned using photolithographic wet chemical techniques. The masking metal must have a differential sputtering rate relative to the conductor layer such that the masking metal thickness will allow conventional wet chemical selective metal removal without significant geometry changes from resist undercut. Further, the masking metal must not react with the conductor metal such as to make significant changes in its properties. Aluminum sputters slowly relative to gold, but aluminum thicknesses required for clearing gold of greater or equal to 1 micrometers thickness are marginal for achieving line widths for separations of less than 3 micrometers. Further, aluminum reacts with gold readily requiring the presence of barrier metal between the gold and aluminum. The barrier metal must also sputter more rapidly than the aluminum or be very much thinner. At the very least, the barrier metal must be sputter etched, requiring either thinner gold or thicker aluminum to accomodate the increase in etching time. In addition, semiconductor device surfaces are usually sensitive and sputter etch removal of the metal of the device surface can result in device damage. Since silicon dioxide, a conventional device surface dielectric also sputters reasonably well, sputter etching to clear metal can result in excessive oxide removal, introduction of shorts and device electrical instabilities. As is well known, gold does not adhere well to silicon dioxide surfaces and any gold interconnect system must employ an adhesion layer. This layer also serves as a barrier layer between the gold and the semiconductor contact areas. Three typically used barrier systems are;

1. Ti—Pt—Au
2. Mo—Au
3. Ti:W—Au

The first barrier system listed above has been employed with sputter etching to obtain single level metalization and interconnect geometries. It has been primarily used for platinum and/or Ti removal from between the pattern gold leads and not for the primary conductor system itself. The possibility exists of using Ti—Pt—Au—Pt—Ti and wet etching the Ti, using a low pressure of oxygen to passivate the titanium, and sputter etching the Pt—Au—Pt layers. Since the bottom titanium layer would resist sputter etching as does the top titanium layer, wet etching would be required to pattern this layer. If the sputter etching has passivated the bottom titanium layer while clearing the gold patterns, wet etching would require HF containing solution, thus increasing the risk of damage of device surface dielectrics and the probability of titanium undercut. Since the top titanium layer would be removed along with clearing the bottom layer, the resulting Ti—Pt—Au metalization would be unsuitable for conventionally deposited dielectric insulation for double level metal application, i.e., as noted above gold does not adhere well to $SiO_2$ surfaces. The second barrier system noted above, i.e., Mo—Au—Mo could be sputter etched by first adding an aluminum layer, then patterning the aluminum with photolithographic wet chemical etching [the top MO and Al layers can be patterned separately or simultaneously by appropriate metal etch selection], then similarly patterning the top Mo layer and using a low $O_2$P.P. in argon to sputter etch the gold. The bottom Mo layer could then be etched out using the Al to mask the top Mo. This latter arrangement has as a drawback the fact that molybdenum has a tendency to undercut.

To overcome these various difficulties, the present invention uses a metalization comprising Ti:-W—Au—Ti:W. The Ti:W is deposited by sputtering from a powder pressed target containing 10–20% Ti and 80–90% tungsten by weight. The gold is then either sputter deposited or E beamed or filament evaporated. The top Ti:W layer is then sputtered, after which an aluminum layer is deposited by any convenient means. Better results are obtained if the Al grain boundries are stable to 200° C temperature excursions. The aluminum is then patterned photolithographically and chemically etched after which the Ti:W is then etched in $H_2O_2$. The gold is then sputter etched at 0.5 to 3 mili torr in 0.5 to 5% oxygen in argon. Power density is determined by heat transfer characteristics of the sputtering configuration but slice temperature should be kept below 200° C. After the gold has been removed, forming lead patterns, the bottom Ti:W is removed using $H_2O_2$ to electrically isolate the lead geometry. During this portion of the process, the aluminum serves as an etch mask for the top Ti:W layer since it is not attacked by $H_2O_2$. Next, the aluminum is removed in a solution similar to the one in which it was patterned leaving a Ti:W—Au—Ti:W metalization and interconnect pattern on the semiconductor device substrate. The Au portion will have sloping sides so that a dielectric layer may then be applied to serve as an insulator for a second level metalization or as scratch protection of the first level. Because of the sloping sides when a second level of metalization is placed thereon, difficulties at crossovers which were present in prior art processes will be avoided. Various insulating layers are disclosed. For communication between the first metal pattern and the second level pattern, insulation can be selectively removed at interconnections sites otherwise known as vias or feed throughs. Means are disclosed for removing this insulation layer at these portions. The second layer of metalization may then be deposited and etched using the same techniques or alternatively by using conventionally available techniques.

DETAILED DESCRIPTION OF THE PREFERRED EMBODIMENT

Figure 1:
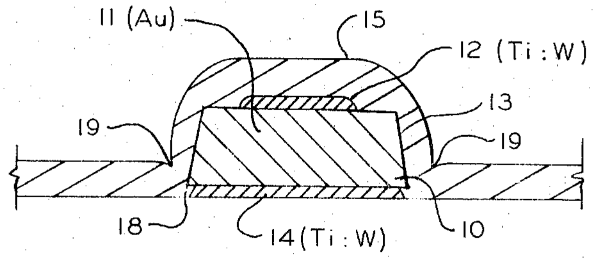
FIG. 1 is a cross sectional view of a prior art metalization system illustrating the problem at cross overs.
Figure 2:
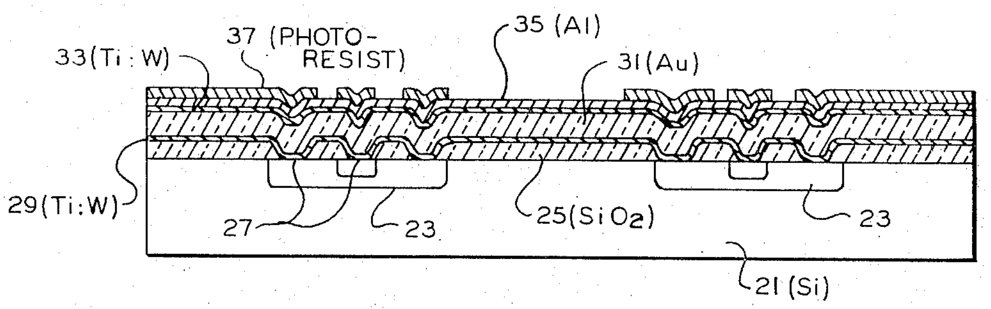
FIG. 2 is a cross sectional view showing the layers of the present invention with an etched photoresist.
Figure 3:
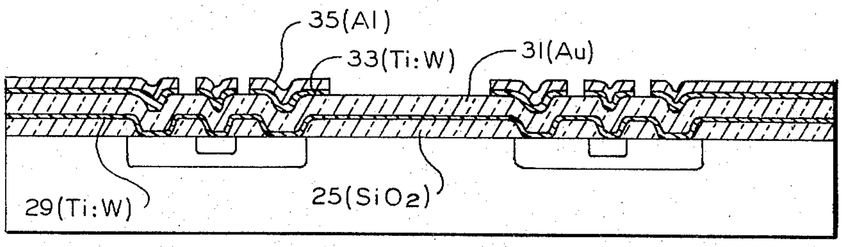
FIG. 3 is a similar view after removal of the Al for masking, the photoresist and the etching of the top Ti:W layer.

FIG. 2 illustrates a typical surface to which the method of the present invention is applied. A chip will have been manufactured in conventional fashion on a substrate of silicon 21 onto which a plurality of semiconductor devices 23 will have been formed. As is well known, a layer of silicon dioxide 25 is formed over the silicon substrate. In the area where contact is to be made, the silicon dioxide layer is cleaned away and a thin layer of platinum deposited thereon. This platinum is then reacted with the silicon in the device to form a layer of platinum silicide [PtSi] 27. A layer 29 of Ti:W is then deposited over the device surface. This is done by sputtering from a powder press target containing 10–20% Ti and 80–90% tungsten by weight. Atop this layer a gold layer 31 is either sputter deposited, E beam evaporated or filiment evaporated. Over the gold layer 31 another layer 33 of Ti:W is then sputtered. Over this layer, a layer 35 of aluminum is then deposited using any convenient means. On top the aluminum is deposited a layer of conventional photo-resist material 37. The photo resist material is then patterned photolithographically as shown after which the aluminum is wet chemically etched in a solution of $H_3PO_4$ , $HNO_3$ and HAc. This solution does not attack gold or Ti:W. The aluminum thickness which is deposited is kept between 0.1 and 0.2 micrometers to limit undercut to these dimensions. After the photolithographic and wet chemical etch, the top layer of Ti:W is then etched in 30–35% $H_2O_2$ at about 25° C. Under these conditions, there will be very little undercut of the Ti:W even with 100% over-etch. The result will be as shown on FIG. 3. The Al layer 35 and Ti:W layer 33 are now present only in areas where interconnects are desired. As illustrated, all of the Ti:W of the upper layer has been removed except that underneath the Al layer 35. Virtually, no undercut will occur in this process.

The next step comprises sputter etching of the gold. Sputter etching along with the other techniques discussed herein is well known in the art. For the explanation of such techniques see "Handbook of Thin Film Technology" edited by L. I. Maissel and R. Glang, [McGraw-Hill, 1970.] The gold is sputter etched at from about 0.5 to 3 mili-torr and 0.5 to 5% oxygen in Argon. Power density is determined by the heat transfer characteristics of the sputtering configuration in well known fashion. However, slice temperature should be kept below 200° C.

Slice temperature must be kept below 350° C and the sputtering pressure must be kept at less than 5 militorr to ensure proper geometry. The sputtering gas must be an inert gas such as argon, krypton, etc., with a 0.5 to 2.% oxygen to passivate the Al without passivating the Ti:W to both wet etch and sputter etch. Optimum conditions are one micron and 1% $O_2$. The bottom layer 29 of Ti:W is then removed using a solution of 30 to 35% $H_2O_2$. The aluminum 35 serves as an etch mask for the top Ti:W layer 33, since aluminum is not attacked by this solution. Also, since the Ti:W does not undercut either the aluminum or the gold, this is not a critical process step. The result after the removal of the bottom Ti:W layer can be seen on FIG. 4. With this removal, the contact being formed is electrically isolated from the remainder of the circuit. Note as shown on FIG. 4 that the gold layer 31 will have sides which slope due to the sputter etching technique as opposed to the more perpendicular sides obtained through prior art methods of wet chemical etching. That is, except in the areas 43, which may be generally designated the interconnect areas, all metal down to the silicon dioxide layer 25 has been removed.

Figure 4:
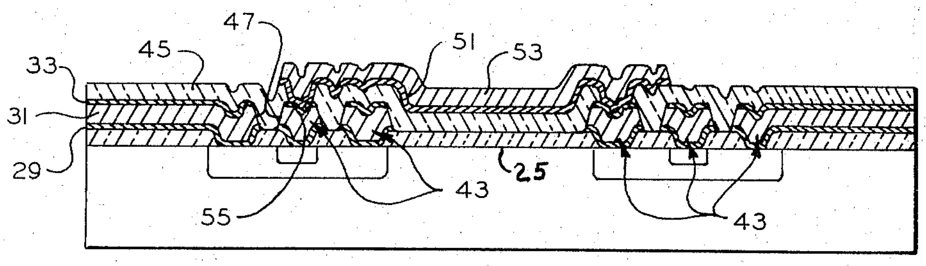
FIG. 4 is a similar view of the completed metalization covered with an insulating layer and a second metal layer.

The next step comprises removing the aluminum mask in a solution such as that noted above using wet chemical etching. Thus, only the metal elements shown on FIG. 4 are now present. The system is applicable to small geometry: patterning line widths and separations may equal metal thickness i.e., on the order of one micrometer for one micrometer thick metal. In addition to the use of Ti:W—Au, the system may also be used with Ti:W—Cu and Ti:W—Ag. Sputtering etching is also possible with the Ti:W layers i.e., all layers except the Al are sputtered etched with the Al wet etched. Similarly, the Al and top Ti:W layer may be wet etched and the gold and bottom Ti:W layers sputter etched. The Ti:W layer may also be plasma vapor etched in $CF_4$ and the remaining metal sputter etched. Al may be wet etched, the first Ti:W layer, the aluminum and top Ti:W layer can be wet etched, the gold sputter etched and the bottom Ti:W layer either wet etched or plasma etched. Thus in general, the Ti:W layers can be removed through wet etching, sputter etching or plasma etching, with any combination being used for removing the two layers. The only requirements are that the gold be sputtered etched and that the aluminum be wet etched.

The chip is now ready for the application of a dielectric material so that a second level of metalization may be deposited and etched. This insulation layer is also shown on FIG. 4. Thus, there is shown a layer 45 of insulating material. Such an insulation may comprise, for example, a layer 1,500 to 1,800 angstroms thick of $Si_3N_4$ film deposited by plasma vapor deposition followed by a silicon dioxide layer 5 to 15,000 angstroms thick deposited by C.V.D. (chemical vapor deposition) [from $SiH_4 + O_2$]. The nitride layer adheres well to the gold edges of the lead system, i.e., at the points 47. As noted above, silicon dioxide does not adhere particularly well to gold. The silane oxide forms the principal insulation.

The insulating dielectric can also be a layer of RF sputtered $SiO_2$ and a layer of silane plus $O_2$ formed by C.V.D. of $SiO_2$. Any normal insulation which provides adequate adhesion and dielectric separation may also be used. Note that because of the sloping of the gold which was accomplished through the sputter etching the oxide layer and thus, another metal layer placed on top thereof will not have sharp edges which can lead to cracking and opening up of the conductive paths. To form vias or feed throughs in the insulation at interconnections sites, the silane oxide can be removed using photolithographic masking with an etching solution containing such HF etchants as BELL-2. The plasma vapor deposited nitrate can be removed by plasma vapor etching with $CF_4$. The Ti:W will be attacked to some degree by the $CF_4$ but much more slowly than the nitride. Proper timing will permit the top Ti:W to act as an etch stop off. The top Ti:W layer may then be removed in 30–35% $H_2O_2$ to yield gold metal at the vias. For use as a second level metalization, Ti:W—Au may also be deposited and patterned as previously described. The low undercut characteristics of the Ti:W reduce via insulation overhang to tolerable levels for first level to second level continuity. The gold to Ti:W provides low resistance between interlevel contacts. Of course, other more conventional metal systems may also be used. Such a second level is indicated by the Ti:W layer 51 and the gold layer 53. The portions 55 where the insulation layer 45 has been removed are the vias or feed throughs. As illustrated, at the vias 55, a Ti:W to Ti:W contact is formed. As noted above, the top Ti:W layer of the bottom level may be removed to obtain contact between the Ti:W layer 51 and the gold layer 31 at the vias 55.

Thus, an improved method for forming interconnections on a semiconductor slice has been described. Although a specific embodiment has been illustrated and described, it will be obvious to those skilled in the art that various modifications may be made without departing from the spirit of the invention which is intended to be limited solely by the appended claims.

What is claimed is:

1. A method of forming interconnections on a semiconductor slice, comprising:

a. depositing a layer of Ti:W on said slice;
b. depositing over said layer a conductor metal having a high conductivity;
c. depositing over said conductor metal a second layer of Ti:W,
d. depositing over said layer of Ti:W a layer of aluminum;
e. photolithographically patterning and wet chemically etching said aluminum to leave an aluminum pattern representing the desired interconnection pattern on the slice;
f. removing the exposed portions of said second layer of Ti:W,
g. sputter etching the exposed portions of said conductor layer; and
h. removing the exposed portions of said first layer of Ti:W.

2. The invention according to claim 1 and further including the step of removing the remaining aluminum and depositing over said slice a layer of dielectric insulating material.

3. The invention according to claim 2 wherein said dielectric material comprises $SiO_2$ deposited using C.V.D. from an $SiH_4 + O_2$ reaction.

4. The invention according to claim 2 wherein said insulating dielectric is deposited by RF sputtering an $SiO_2$ layer and depositing a layer of $SiO_2$ by C.V.D. of Silane + $O_2$.

5. The invention according to claim 2 wherein said insulating layer comprises a film of plasma vapor deposited silicon nitride and a layer of silane $SiO_2$ formed by C.V.D.

6. The invention according to claim 5 wherein said nitride layer is between 1,500 and 1,800 angstroms thick and said silane $SiO_2$ layer 5,000–10,000 angstroms thick.

7. The invention according to claim 1 wherein said sputtering pressure is less than 5 mili torr and the sputtering gas comprises an inert gas with 0.5 – 5% $O_2$ mixed therewith.

8. The invention according to claim 1 wherein said conductor layer is one of the group consisting of copper, gold and silver.

9. The invention according to claim 8 wherein said conductor layer is gold.

10. The invention according to claim 1 wherein said first and second Ti:W layers are sputter etched.

11. The invention according to claim 1 wherein said second Ti:W layer is wet etched and said first Ti:W layer sputter etched.

12. The invention according to claim 1 wherein said first and second Ti:W layers are plasma vapor etched in $CF_4$.

13. The invention according to claim 1 wherein both said first and second Ti:W layers are wet etched.

14. The invention according to claim 1 wherein said second Ti:W layer is plasma etched and said first Ti:W layer is wet etched.

15. The invention according to claim 1 wherein said top Ti:W layer is wet etched and said bottom Ti:W layer is plasma vapor etched in $CF_4$.

* * * * *